USOO6044033A

United States Patent [19]
Jang

[11] Patent Number: 6,044,033
[45] Date of Patent: Mar. 28, 2000

[54] NOR-TYPE NONVOLATILE SEMICONDUCTOR MEMORY DEVICE AND A METHOD FOR READING THEREFROM

[75] Inventor: Cheol-Ung Jang, Kyunggi-do, Rep. of Korea

[73] Assignee: Samsung Electronics Co., Ltd., Suwon, Rep. of Korea

[21] Appl. No.: 09/221,978

[22] Filed: Dec. 29, 1998

[30] Foreign Application Priority Data

Dec. 30, 1997 [KR] Rep. of Korea .................. 97-79448

[51] Int. Cl.[7] ............................................ G11C 8/00
[52] U.S. Cl. ............................. 365/230.03; 365/189.09
[58] Field of Search .................... 365/230.03, 189.09, 365/230.06, 189.05, 189.01, 230.01

[56] References Cited

U.S. PATENT DOCUMENTS 5,886,937 3/1999 Jang ...................................... 365/203

OTHER PUBLICATIONS

Mikiro Okada et al., "16Mb ROM Design Using Bank Select Architecture," Symposium on VLSI Circuits, pp. 85–86, Aug. 1988.

Primary Examiner—David Nelms
Assistant Examiner—David Lam
Attorney, Agent, or Firm—Jones Volentine, L.L.P.

[57] ABSTRACT

A NOR-type read only memory with improved read-out performance includes a memory cell array having a plurality of memory cell blocks, each memory block including a plurality of bit lines, a column decoder for generating a plurality of decoding signals in response to a plurality of address signals, a first bias/ground selection control circuit for generating a plurality of first bias/ground selection signals determining bias conditions for a first group of the plurality of bit lines, a first bias/ground selection circuit for establishing bias conditions of the first group of the plurality of bit lines in response to the first bias/ground selection signals generated from the first bias/ground selection control circuit, a second bias/ground selection control circuit for generating a plurality of second bias/ground selection signals determining bias conditions of a second group of the plurality of bit lines, and a second bias/ground selection circuit for establishing bias conditions of the second group of the plurality of bit lines in response to the second bias/ground selection signals generated from the second bias/ground selection control circuit.

8 Claims, 10 Drawing Sheets

NOR-TYPE NONVOLATILE SEMICONDUCTOR MEMORY DEVICE AND A METHOD FOR READING THEREFROM

FIELD OF THE INVENTION

The invention relates to nonvolatile semiconductor memory devices having NOR-type memory arrays of a plurality of memory cells each storing a single bit or multiple bits and a method for reading out data from the memory cells.

BACKGROUND OF THE INVENTION

Masked ROMs with NOR-type memory cell arrays in which bit lines are constructed in a hierarchical arrangement have been disclosed in "16*Mb ROM Design Using Bank Select Architecture*," Symposium on VLSI Circuits, pp.85–88, Aug. 1988. In the technique disclosed in the a fore-mentioned article, the reading-out process is accomplished through three steps: precharging main bit lines to predetermined voltage levels; sensing a voltage level of a main bit line to determine whether a selected memory cell is an on-cell or an off-cell; and outputting data detected from the selected memory cell to the output of the memory device. Referring to FIG. 1, in order to sense data stored in a memory cell of a memory block, a pair of bank selection lines BS1 and BE2 are activated to select main bit line MB5, and a power supply voltage is applied to word line WL0 connected to the selected memory cell M81. The voltage level designating a data bit from memory cell M81 is detected in sense amplifier SA5, in accordance with the state of current flowing through the selected memory cell. If the selected memory cell M81 is an on-cell, a voltage level at the corresponding main bit line MB5 is lowered under the precharged level. On the other hand, if the selected memory cell is an off-cell, the precharged level of the main bit line MB5 is maintained therein.

However, in the case where: the selected memory cell M81 is an on-cell; M41 corresponding to main bit line MB3 is an off-cell; and M51, M61 and M71 are all on-cells; then, since the bank selection lines BS1 and BE2 are enabled and word line WL0 is activated, a current path through the channels of M51, M61 and M71 is formed such that current is poured into sub bit line SBL8, thereby disturbing the sensing current on sub bit line SBL9 connected to main bit line MB5. This disturbance, due to the current from the on-cells M51 through M71 results in a malfunction in detecting the state of the selected memory cell M81. M81 may be regarded to as an off-cell because the voltage level of the main bit line MB5 can not be lowered due to the disturbance of flowing current.

Furthermore, assuming that the selected memory cell M81 is an off-cell and adjacent memory cells M91, M101 and M111 are all on-cells, leakage current through the adjacent on-cells is formed to degrade the sensing stability for the selected memory cell M81. As a result, whatever the state of the selected memory cell is, the performance in sensing the memory cell may be degraded.

SUMMARY OF THE INVENTION

It is an object of the invention to provide a nonvolatile memory having an improved capability for sensing a memory cell.

It is another object of the invention to provide a nonvolatile memory capable of improved sensing speed and stability.

In order to accomplish those objects, a NOR-type read only memory is provided to improve read-out performance. The memory includes a memory cellarray having a plurality of memory cell blocks, each memory cell block including a plurality of bit lines, a column decoder for generating a plurality of decoding signals in response to a plurality of address signals, a first bias/ground selection control circuit for generating a plurality of first bias/ground selection signals determining bias conditions of a first group of the plurality of bit lines, a first bias/ground selection circuit for establishing bias conditions of the first group of the plurality of bit lines in response to the first bias/ground selection signals generated from the first bias/ground selection control circuit, a second bias/ground selection control circuit for generating a plurality of second bias/ground selection signals determining bias conditions of a second group of the plurality of bit lines, and a second bias/ground selection circuit for establishing bias conditions of the second group of the plurality of bit lines in response to the second bias/ground selection signals generated from the second bias/ground selection control circuit.

A Y-pass gate is connected between the first selection circuit and a sense amplifier circuit. The first selection signals generated from the first selection control circuit include a plurality of bias selection signals and a plurality of ground selection signals. The first selection control circuit includes circuit means for adjusting the voltage level of the bias selection signal. The second selection signals generated from the second selection control circuit also include a plurality of bias selection signals and a plurality of ground selection signals.

BRIEF DESCRIPTION OF THE DRAWINGS

For a better understanding of the invention, and to show how embodiments of the same may be carried into effect, reference will now be made, by way of example, to the accompanying drawings, in which.

In the figures, like reference numerals denote like or corresponding parts.

DETAILED DESCRIPTION OF THE PREFERRED EMBODIMENTS

Figure 1:
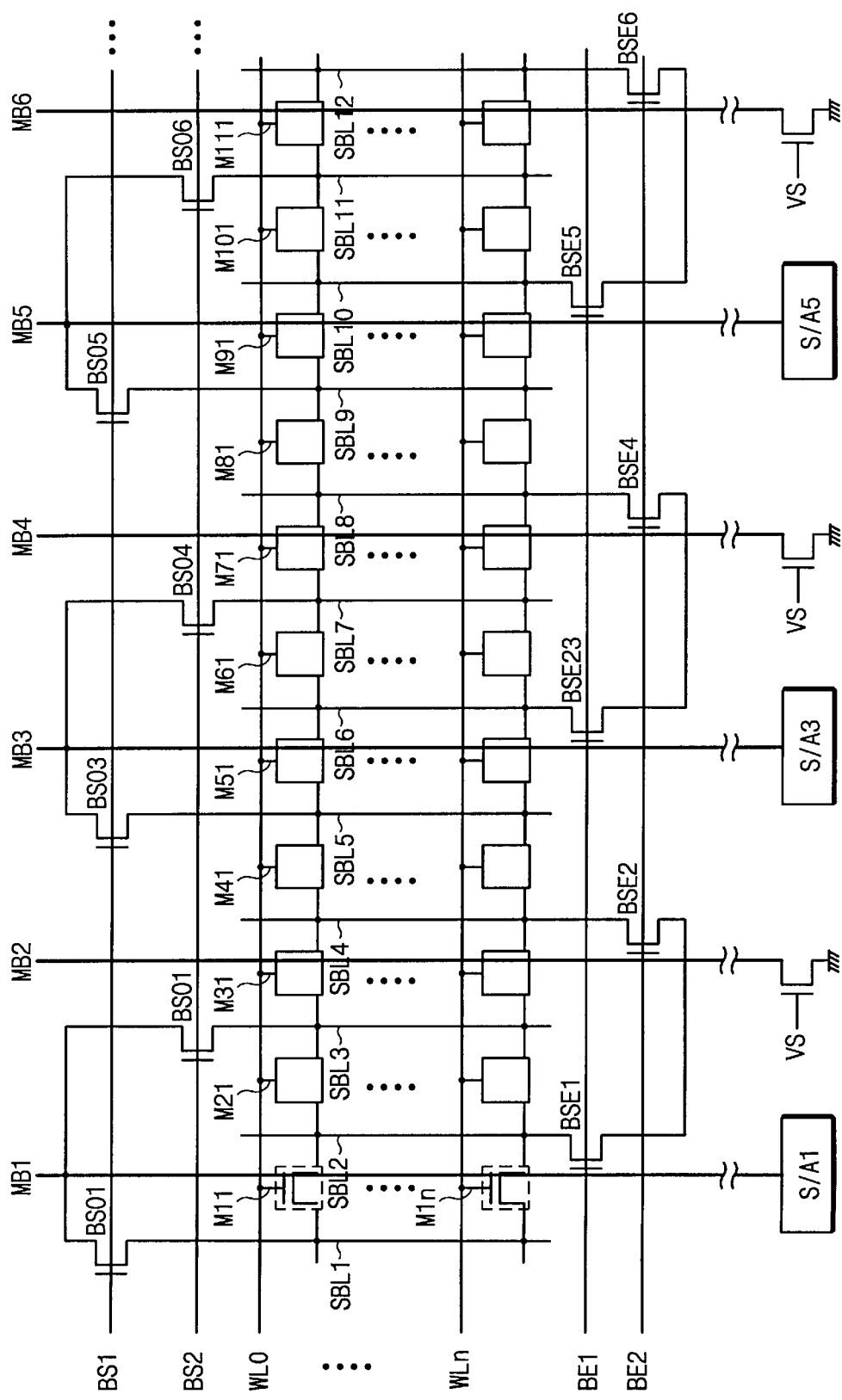
FIG. 1 shows a construction of a NOR-type memory cell array of a conventional nonvolatile memory device.
Figure 2:
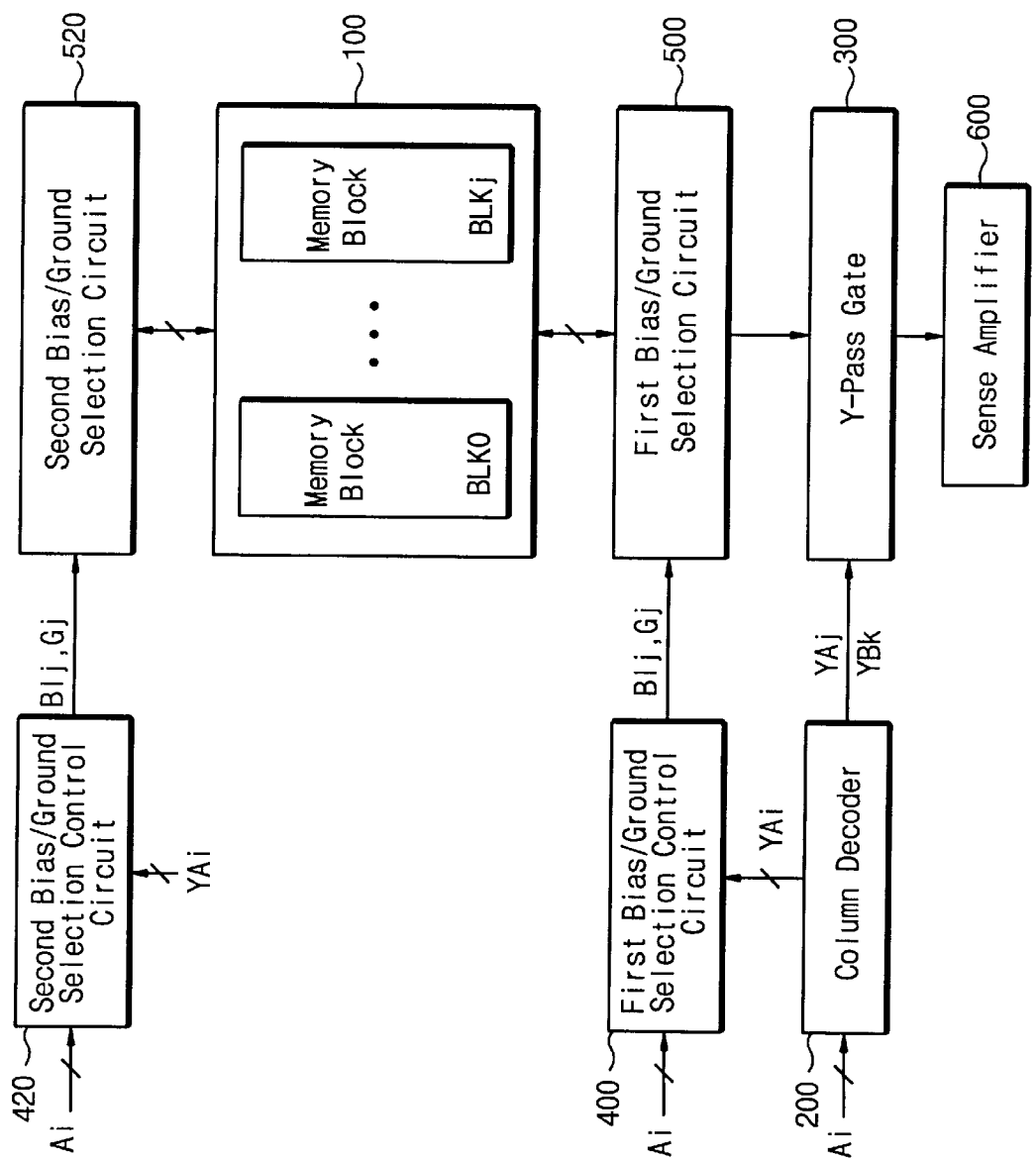
FIG. 2 is a block diagram illustrating a functional construction of a memory device according to one or more aspects of the present invention.

Referring to FIG. 2, a masked ROM includes memory cell array 100, column decoder 200, Y-pass gate 300, first bias/ground selection control circuit 400, second bias/ ground selection control circuit 420, first bias/ground selection circuit 500, second bias/ground selection circuit 520 and sense amplifier 600. Memory cell array 100 is composed of a plurality of memory blocks BLKO-BLKJ. Column decoder 200 receives address signals $A_i$ and then generates decoded signals YAi, YAj and YBk. The signals YAi are applied to first and second bias/ground selection control circuits 400 and 420. YAj and YBk are applied to Y-pass gate 300 to select columns which connects bit lines and sense amplifier 600. First bias/ground selection control circuit 400 receives address signals Ai and decoded signals YAi from column decoder 200, and then generates bias selection signals BIj and ground selection signals Gj which are applied to first bias/ground selection circuit 500. Second bias/ground selection control circuit 420 receives address signals Ai and decoded signals YAi from column decoder 200, and then generates bias selection signals $BI_j$ and ground selection signals Gj which are applied to second bias/ground selection circuit 520. The first and second bias/ground selection circuits, 500 and 520, are positioned at the top and bottom of memory cell array 100 and alternatively selects main bit line of the memory cell array into bias lines and ground lines.

Figure 3A:
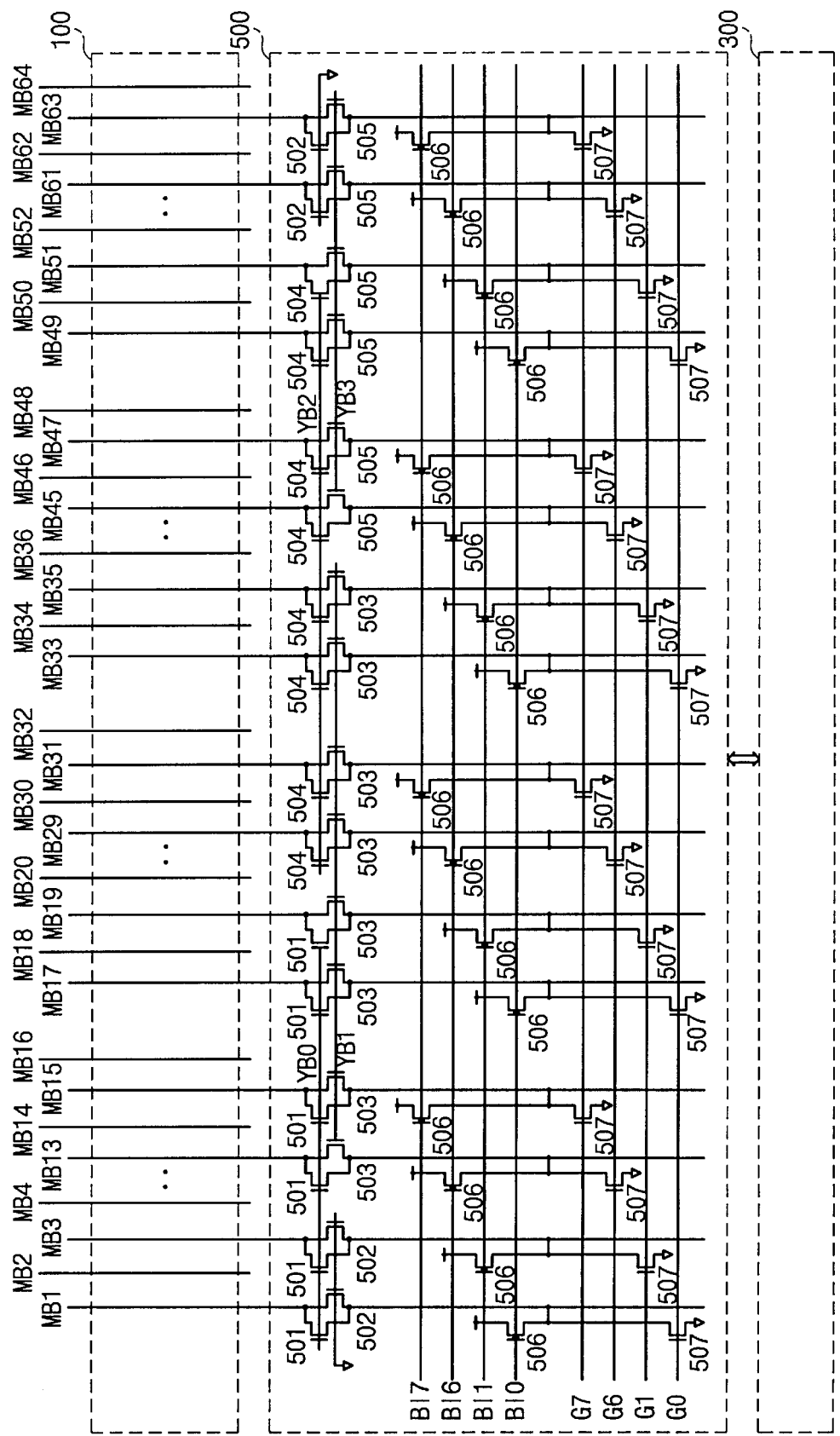
FIGS. 3A and 3B show correlated features between a memory cell array and peripheral circuits.
Figure 3B:
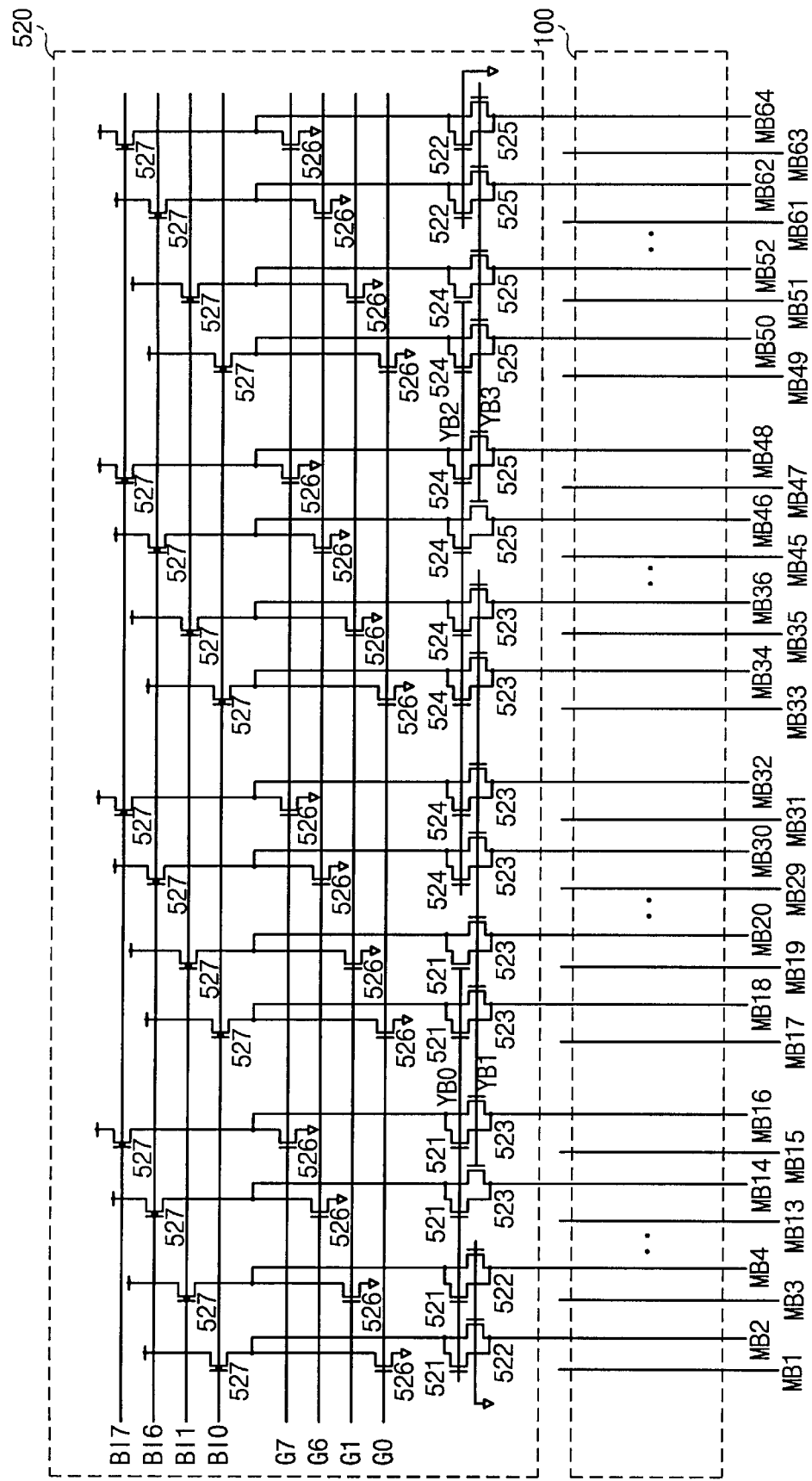

FIGS. 3A and 3B show interconnecting features between the memory cell array block and bias/ground selection circuits. Main bit lines MB1–MB64 are included into a memory block of memory cell array 100. Referring to FIG. 3A, first bias/ground selection circuit 500 includes NMOS transistors 501~505 which connect odd-ordered main bit lines MB1, MB3, . . . MB63 thereto, PMOS transistors 506 charging the odd-ordered main bit lines into a bias voltage level in response to bias selection signals BI0, BI1, BI7 and BI8, and NMOS transistors 507 discharging the odd-ordered main bit lines to the ground level in response to ground selection signals G0, G1, G6 and G7. And, referring to FIG. 3B, second bias/ground selection circuit 520 includes NMOS transistors 521~525 which connect even-ordered main bit lines MB2, MB4, . . . MB64 thereto, NMOS transistors 526 discharging the even-ordered main bit lines to the ground level in response to ground selection signals G0, G1, G6 and G7, and PMOS transistors 527 charging the even-ordered main bit lines to the bias voltage level.

The number of units of bias/ground selection circuits corresponds to that of memory blocks divided in memory cell array 100.

Figure 4A:
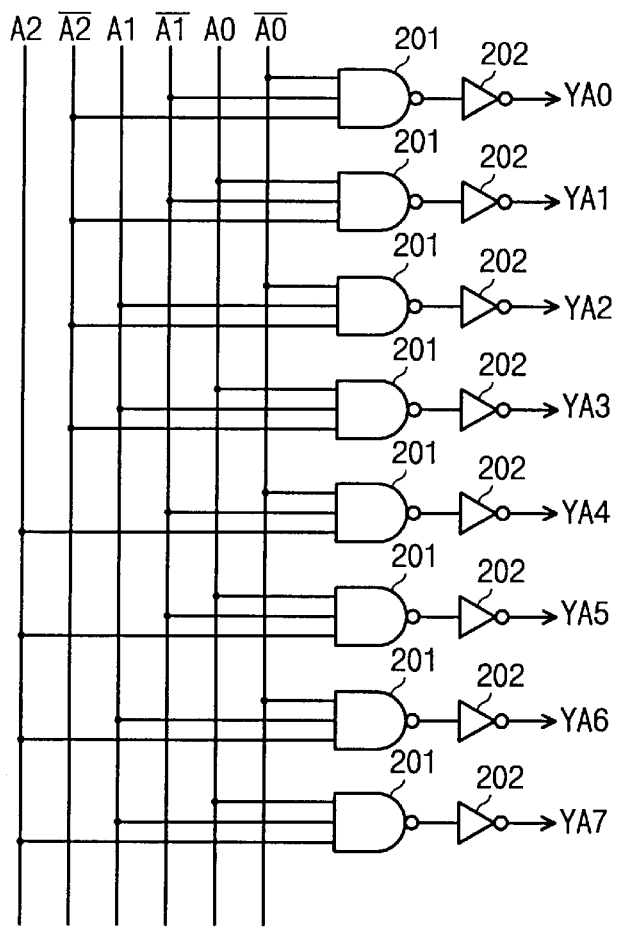
FIGS. 4A and 4B are logical circuit diagrams of column decoders.
Figure 4B:
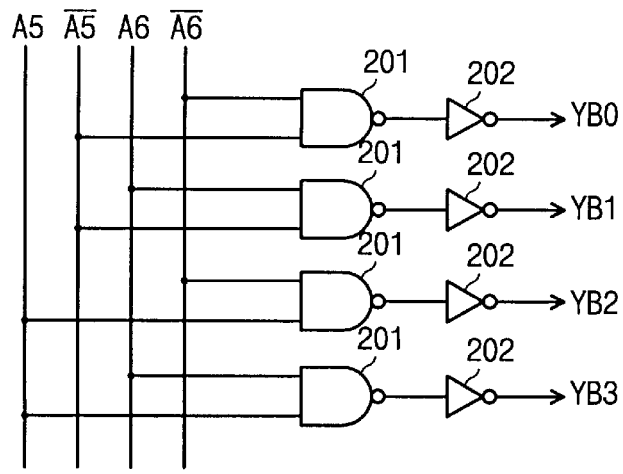

Column decoder 200, as shown in FIGS. 4A and 4B, are constructed of plural NAND gates 201 receiving address signals A0, /A0, A1, /A1, A2, /A2, A5, /A5 and A6, /A6, and plural inverters 202 converting outputs of the NAND gates into decoded signals YA0–YA7 and YB0–YB3 which are used in selecting main bit lines and ground lines. The ground lines are the main bit lines which are connected to the ground by the ground selection signals.

Figure 5:
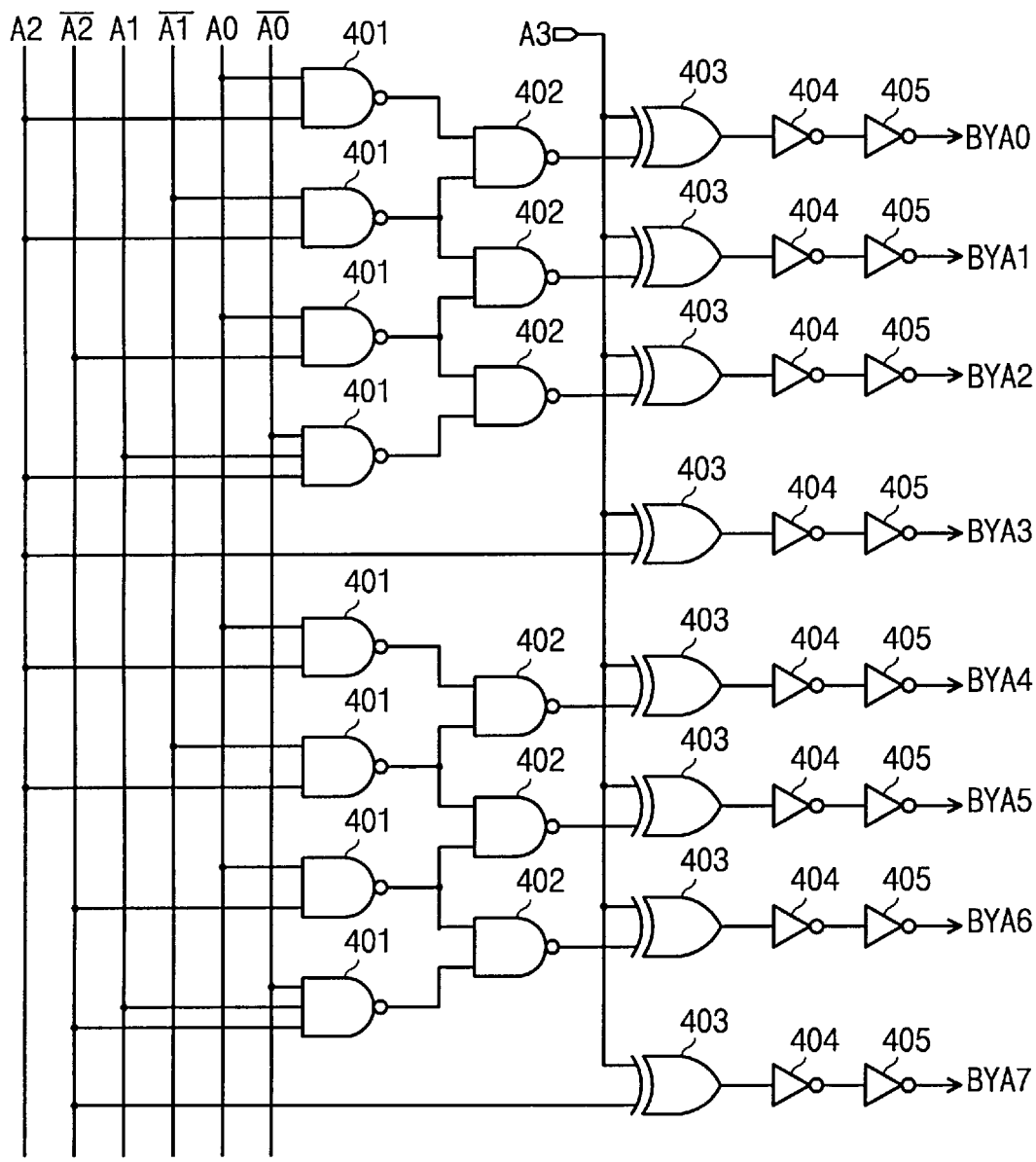
FIG. 5 is a logical circuit diagram for generating signals to control a selection of a bias voltage and a ground voltage.

FIG. 5 shows a logic circuit which is commonly included in the bias/ground selection control circuits 400 and 420. NAND gates 401 receive address signals A0, /A0, A1, /A1 and A2, /A2, NAND gates 402 receive outputs of NAND gates 401 and then apply their outputs to inputs of exclusive-OR gates (XOR) 403 which are controlled by address signal A3. Outputs of XOR gates 403 are modified to signals BYA0–BYA7 through serially connected inverters 404 and 405. The signals BYA0–BYA7 are applied to the respective circuits of FIGS. 6A and 6B which generate the bias and ground selection signals.

Tables 1 and 2 below show decoded configurations arranged in the circuit of FIG. 5, in which Table 1 and 2 apply when address signal A3, controlling the inputs of XOR gates 403, is a logic "1" and a logic "0", respectively.

TABLE 1

(A3 = 1)

| A2 | A1 | A0 | BYA0 | BYA1 | BYA2 | BYA3 | BYA4 | BYA5 | BYA6 | BYA7 |
|---|---|---|---|---|---|---|---|---|---|---|
| 0 | 0 | 0 | X(0) | 1 | 1 | 1 | 0 | 0 | 0 | 0 |
| 0 | 0 | 1 | 0 | X(1) | 1 | 1 | 1 | 0 | 0 | 0 |
| 0 | 1 | 0 | 0 | 0 | X(0) | 1 | 1 | 1 | 0 | 0 |
| 0 | 1 | 1 | 0 | 0 | 0 | X(1) | 1 | 1 | 1 | 0 |
| 1 | 0 | 0 | 0 | 0 | 0 | 0 | X(0) | 1 | 1 | 1 |
| 1 | 0 | 1 | 1 | 0 | 0 | 0 | 0 | X(1) | 1 | 1 |
| 1 | 1 | 0 | 1 | 1 | 0 | 0 | 0 | 0 | X(0) | 1 |
| 1 | 1 | 1 | 1 | 1 | 1 | 0 | 0 | 0 | 0 | X(1) |

TABLE 2

(A3 = 0)

| A2 | A1 | A0 | BYA0 | BYA1 | BYA2 | BYA3 | BYA4 | BYA5 | BYA6 | BYA7 |
|---|---|---|---|---|---|---|---|---|---|---|
| 0 | 0 | 0 | X(0) | 0 | 0 | 0 | 1 | 1 | 1 | 1 |
| 0 | 0 | 1 | 1 | X(1) | 0 | 0 | 0 | 1 | 1 | 1 |
| 0 | 1 | 0 | 1 | 1 | X(0) | 0 | 0 | 0 | 1 | 1 |
| 0 | 1 | 1 | 1 | 1 | 1 | X(1) | 0 | 0 | 0 | 1 |
| 1 | 0 | 0 | 1 | 1 | 1 | 1 | X(0) | 0 | 0 | 0 |
| 1 | 0 | 1 | 0 | 1 | 1 | 1 | 1 | X(1) | 0 | 0 |
| 1 | 1 | 0 | 0 | 0 | 1 | 1 | 1 | 1 | X(0) | 0 |
| 1 | 1 | 1 | 0 | 0 | 0 | 1 | 1 | 1 | 1 | X(1) |

It should be noted that the toggling of A3 reverses the logic values of BYAi, which determines whether the first bias/ground selection circuit is connected to a bias voltage (or a precharge voltage) or to a ground voltage, or whether the second bias/ground selection circuit is connected to the ground voltage or the bias voltage (or the precharge voltage).

Figure 6A:
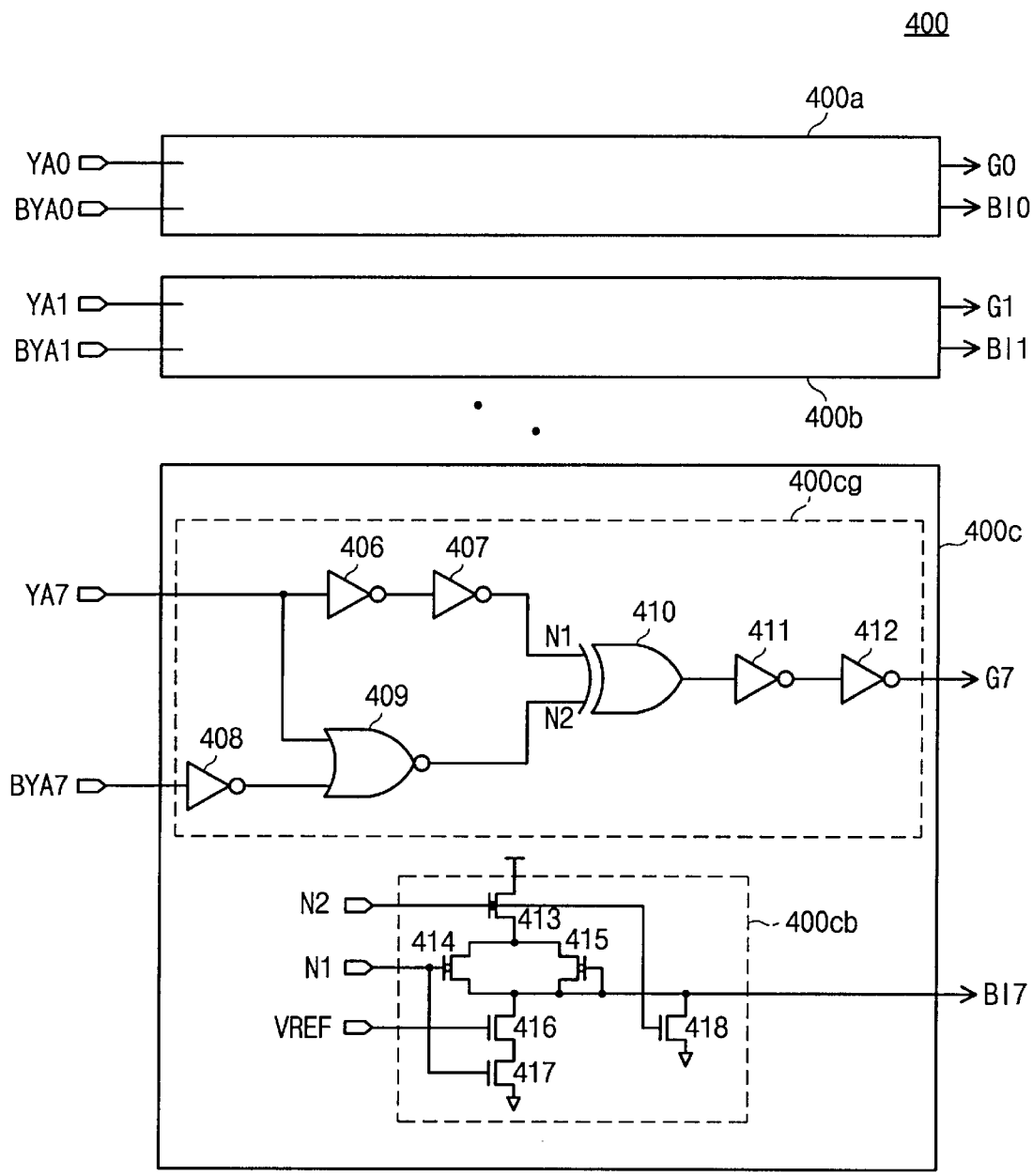
FIG. 6A shows a construction of a circuit for controlling a selection of the first bias voltage and ground voltage.

Referring to FIG. 6A showing first bias/ground selection control circuit 400, each group of circuits for generating bias selection and ground selection signals are provided therein. Unit 400a receives YA0 and BYA0 each from column decoder 200 and the circuit of FIG. 5, and then generates ground selection signal G0 and bias selection signals BI0. Unit 400b receives YA1 and BYA1 each from column decoder 200 and the circuit of FIG. 5, and then generates ground selection signal G1 and bias selection signals BI1. Unit 400c discloses its circuit construction that is the same with that of other units.

In ground selection signal generating circuit 400cg, YA7 generated from column decoder 200 is applied to an input of XOR gate 410 through inverters 406 and 407, and directly applied to an input of NOR gate 409. Decoded signal BYA7 is applied to the other input of NOR gate 409 through inverter 408. Output of NOR gate 409 is applied to the input of XOR gate 410. The output of XOR gate 410 passes though serially connected inverters 411 and 412 to become the ground selection signal G7.

Bias selection signal generating circuit 400cb has a pair of input terminals which are connected to a pair of input nodes of XOR gate 410 in the circuit 400cg, N1 and N2. N2 is coupled to the gate of PMOS transistor 413, which is connected to the power supply voltage, and also coupled to the gate of NMOS transistor 418, which is connected between bias selection signal BI7 and the ground. N1 is coupled to the gate of PMOS transistor 414, which is connected between PMOS transistor 413 and B17, and also coupled to the gate of NMOS transistor 417, which is connected to the ground. PMOS transistor 415 is connected between PMOS transistor 413 and B17, the gate of PMOS transistor 415 being connected to BI7. NMOS transistor 416, whose gate is coupled to reference voltage VREF, is connected between B17 and NMOS transistor 417.

Figure 6B:
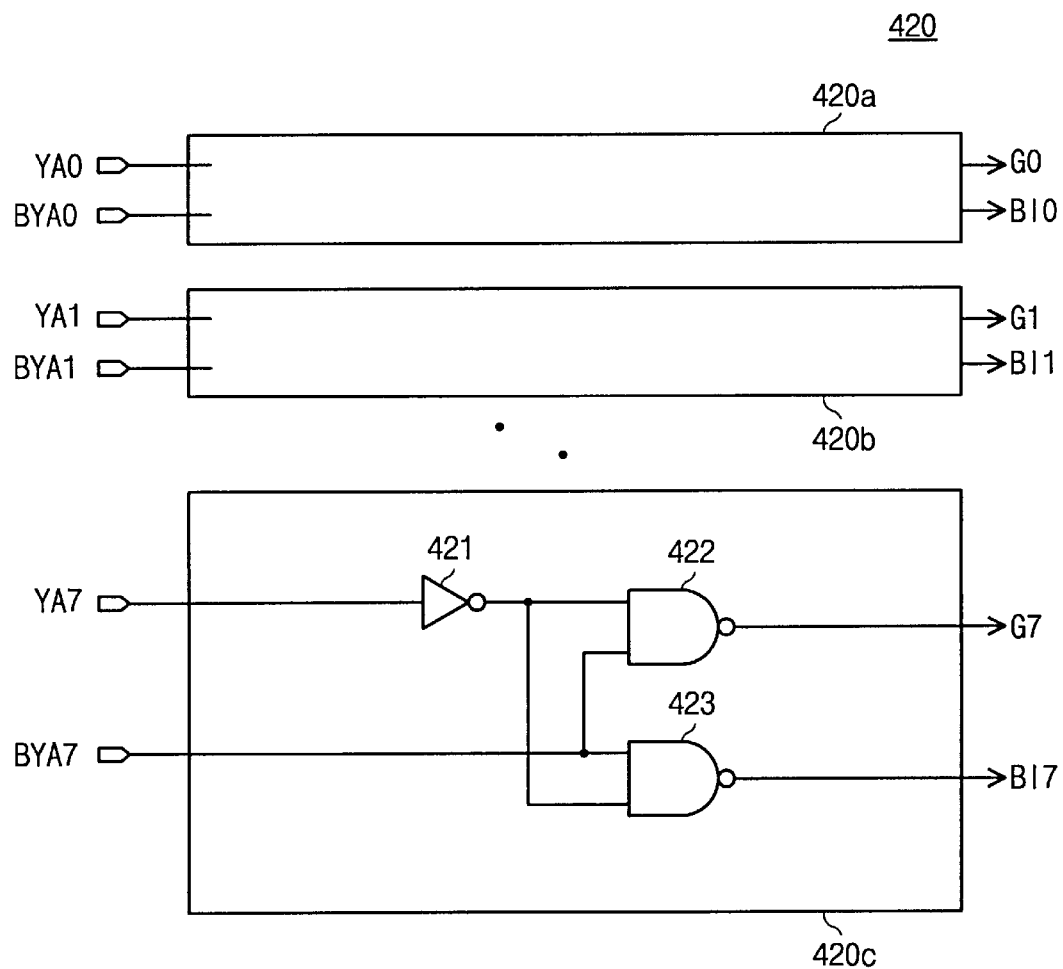
FIG. 6B shows a construction of a circuit for controlling a selection of the second bias voltage and ground voltage.

Second bias/ground selection control circuit 420 shown in FIG. 6B is formed of circuits generating ground and bias selection signals. Unit 420a receives YA0 and BYA0 each from column decoder 200 and the circuit of FIG. 5, and then generates ground selection signal G0 and bias selection signal BI0. Unit 420b receives YA1 and BYA1 each from column decoder 200 and the circuit of FIG. 5, and then generates ground selection signal G1 and bias selection signals BI1. FIG. 6B shows the circuit construction of the unit 420c, which is the same with that of the other units. In unit 420c, YA7 is applied to an input of NAND gate 422 through inverter 421, and BYA7 is applied to an input of NAND gate 423 as well as to the other input of NAND gate 422. The output of inverter 421 is also applied to the input of NAND gate 423. Outputs of NAND gates 422 and 423 become ground and bias selection signals, G7 and BI7, respectively.

Figure 7:
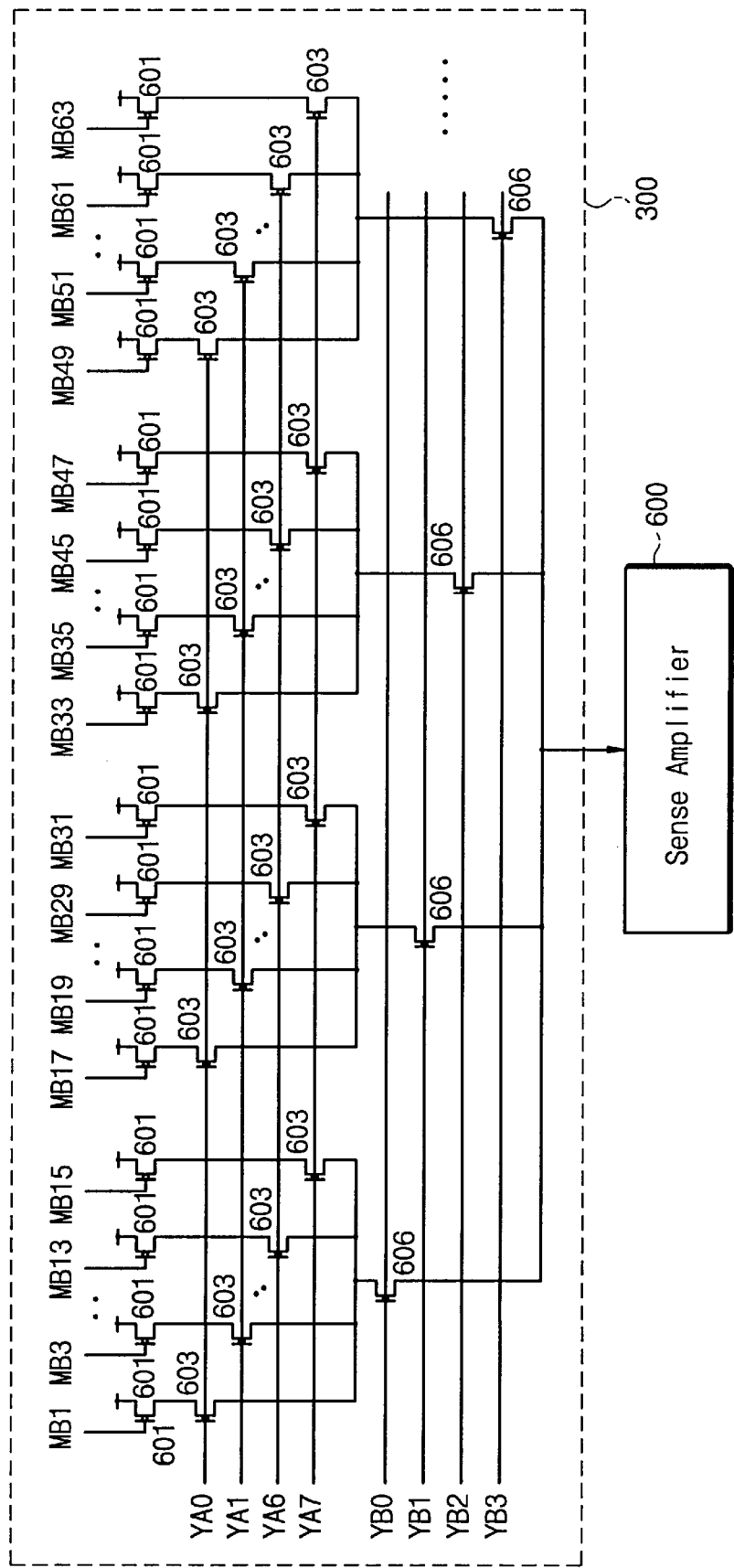
FIG. 7 is a circuit diagram of a Y-pass gate.

As shown in FIG. 7, Y-pass gate 300 includes PMOS transistors 601 whose gates are coupled to main bit lines MB1, MB3 ... MB63. Sources of PMOS transistors 601 are connected to the power supply voltage terminal. Drains of PMOS transistors 601 are connected to sources of NMOS transistors 603 whose gates are coupled to YA0–YA7. Each group of four NMOS transistors 603 is connected to sense amplifier 600 through NMOS transistor 606 whose gate is coupled to YBi (i=0 through 3). Conductivity of the PMOS transistors 601 responds to voltage levels of the main bit lines.

In a read operation, assuming that main bit line MB13 is to be sensed to read out data from the memory cells connected thereto: the presented address is 110 (A2A1A0); A3 is 1; all of the decoded signals YAi from column decoder 200 are 0, except for YA6 (=1); and signals BYAi generated from the circuit of FIG. 5 (commonly included bias/ground selection control circuit 400 and 420) are generated as shown in Table 1. Since YA6=1 and BYA=0, first bias/ground selection control circuit 400 generates G6=0 and BI6=0 while second bias/ground selection control circuit 420 generates G6=1 and BI6=1. In the circuit of FIG. 6A, the voltage level of the BI6 (=0) is determined by the voltage level of VREF, which influences the voltage level precharging the main bit line. The voltage level of BI6 does not completely go down to the ground level.

Next, referring to FIG. 3A, G6 (=0) is applied to the gate of NMOS transistor 507 of first bias/ground selection circuit 500 and thereby turns off the transistor 507, while BI6 turns on PMOS transistor 506 of first bias/ground selection circuit 500 to supply a precharge voltage (as a source voltage for sensing the state of a selected memory cell) to main bit line MB13. Meanwhile, referring to FIG. 3B, G6 (=1) and BI (=1), generated from second bias/ground selection control circuit 420, are each applied to the gates of NMOS and PMOS transistors, 526 and 527, connected to main bit line MB14 which acts a conductive line connecting a selected memory to the ground through the NMOS transistor 526 turned on by G6 of 1.

If a selected memory cell disposed between MB13 and MB14 is an on-cell, the voltage level of MB 13 goes to a low level and thereby causes PMOS transistor 601 of Y-pass gate 300 to be turned on in response to the voltage variation of MB13. Since YA6 is at a high level, the pull-down voltage through PMOS transistor 601 is transferred to sense amplifier 600 through NMOS transistors 603 and 606 (YB=1). On the other hand, when a selected memory cell disposed between MB13 and MB14 is an off-cell, since there is no current path from MB13 to MB14, the voltage level at MB13 retains the precharge voltage level that is preliminary provided through PMOS transistor 506.

While main bit line MB13 is being sensed, main bit lines positioned at the left side of MB13 are set to ground, and main bit lines at the right side of MB14 are held at the bias voltage that is supplied by PMOS transistors 527. According to Table 1, with the address 110, while sensing a selected path through MB13 and MB14 for reading out data stored in a selected memory cell arranged between MB13 and MB14, MB16 is charged to a bias voltage supplied through PMOS transistor 527 of second bias/ground selection circuit 520, which is turned on by BI7 (all PMOS transistors coupled to BI7 are in the same state), and MB6, MB8, MB10 and MB12 are connected to the ground voltage. Therefore, there is no incoming current flowing into the selected sensing path when the selected memory cell between MB13 and MB14 is an on-cell, and there is no leakage current going out of the selected sensing path when the selected memory cell is an off-cell.

Figure 8A:
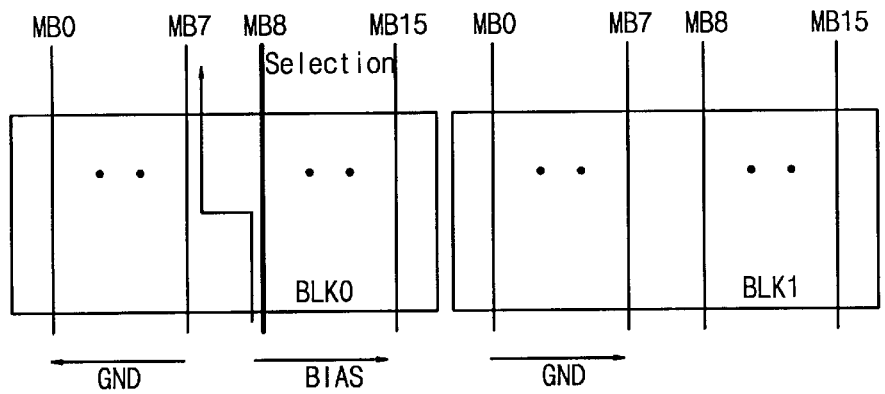
FIGS. 8A through 8C illustrate the flow of sensing current in a memory cell array according to one or more aspects of the present invention, under various conditions.
Figure 8B:
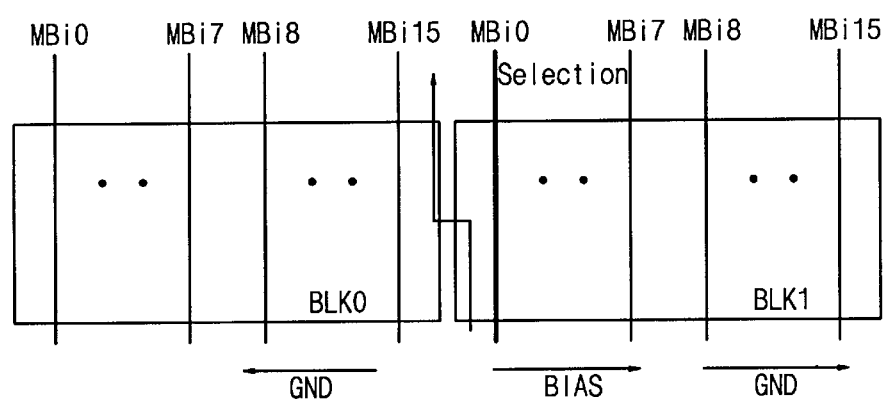
Figure 8C:
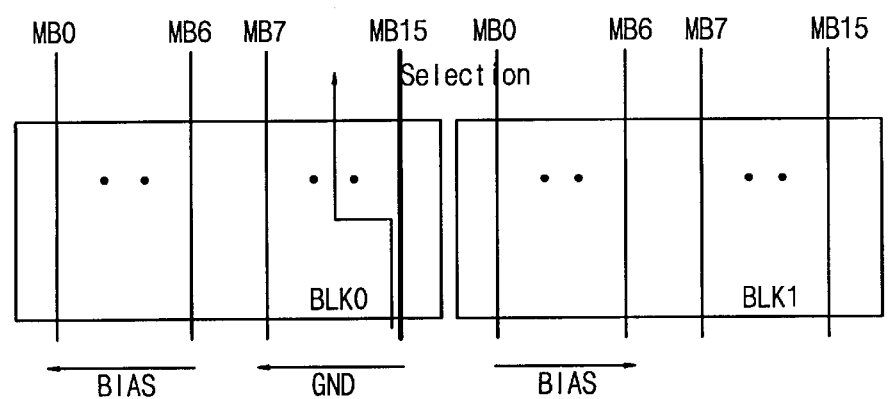

FIGS. 8A through 8C show various bias conditions produced by one embodiment according to the present invention in a case where the number of main bit lines is 16, i.e., from MB0 to MB15, in each of adjacent memory blocks BLK0 and BLK1. Referring to FIG. 8A, when MB8 is selected to be sensed, MB9 through MB15 which are arranged at the right side of MB8 are connected to the bias voltage, and MB0 through MB7 which are arranged at the left side of MB8 are connected to the ground voltage. In the adjacent block BLK1, the bias condition for the main bit lines is the same as that in the block BLK0. As another case, referring to FIG. 8B, assuming that the first main bit line MB0, which is the most adjacent one to BLK0, of main bit lines belong to BLK1 is assigned to a selected memory cell, MB8 through MB15 of BLK0 and BLK1 are held at the ground voltage, and MB1 through MB7 of BLK0 and BLK1 are connected to the bias voltage. FIG. 8C shows the case where the selected main bit line in BLK0 is the most adjacent one to BLK1. As is shown in FIG. 8B, MB8 through MB15 of BLK0 and BLK1 are held at the ground voltage, and MB1 through MB7 of BLK0 and BLK1 are connected to the bias voltage.

As described above, the present invention offers advanced sensing features free from the disturbance in detecting current from on-cells and leakage current by adjacent on-cells, resulting in promoting sensing stability and read-out speed in the NOR-type memory device.

While this invention has been described in connection with what is presently considered to be the most practical and preferred embodiment, it is to be understood that the invention is not limited to the disclosed embodiment, but, on the contrary, is intended to cover various modifications and equivalent arrangements included within the scope of the invention.

What is claimed is:

1. A semiconductor memory device comprising:
    a memory cell array having a plurality of memory cell blocks, each memory block including a plurality of bit lines;
    a column decoder for generating a plurality of decoding signals in response to a plurality of address signals;
    a first selection control circuit for generating a plurality of first selection signals determining bias conditions of a first group of the plurality of bit lines;
    a first selection circuit for establishing bias conditions of said first group of the plurality of bit lines in response to the first selection signals generated from the first selection control circuit;
    a second selection control circuit for generating a plurality of second selection signals determining bias conditions of a second group of the plurality of bit lines; and
    a second selection circuit for establishing bias conditions of said second group of the plurality of bit lines in response to the second selection signals generated from the second selection control circuit.

2. A semiconductor memory device of claim 1, further comprising a pass gate circuit connected between the first selection circuit and a sense amplifier circuit.

3. A semiconductor memory device of claim 1, wherein the first selection signals generated from the first selection control circuit includes a plurality of bias selection signals and a plurality of ground selection signals.

4. A semiconductor memory device of claim 1, wherein the first selection control circuit comprises circuit means for adjusting a voltage level of the bias selection signals.

5. A semiconductor memory device of claim 1, wherein the second selection signals generated from the second selection control circuit includes a plurality of bias selection signals and a plurality of ground selection signals.

6. A semiconductor memory device comprising:
    a memory cell array having a plurality of memory cell blocks, each memory block including a plurality of bit lines connected to a plurality of memory cells, the bit lines being divided into first-ordered bit lines and second-ordered bit lines;
    a column decoder for generating a plurality of decoding signals in response to a plurality of address signals;
    a first selection circuit including a plurality of first transistors connected between first voltage terminals and the first-ordered bit lines, and a plurality of second transistors connected between the first-ordered bit lines and second voltage terminals, the first transistors responding to first selection signals and the second transistors responding to second selection signals; and
    a second selection circuit including a plurality of third transistors connected between the first voltage terminals and the second-ordered bit lines, and a plurality of fourth transistors connected between the second-ordered bit lines and the second voltage terminals, the third transistors responding to third selection signals and the fourth transistors responding to fourth selection signals.

7. A semiconductor memory device of claim 6, wherein the first selection signals connect the first-ordered bit lines to the first voltage terminals through the first transistors, and third selection signals connect the second-ordered bit lines to the first voltage terminal through the third transistors, each of said first voltage terminals having a bias voltage level.

8. A semiconductor memory device of claim 1, wherein the second selection signals connect the first-ordered bit lines to the second voltage terminals through second transistors, and the fourth selection signals connect the second-ordered bit lines to the second voltage terminals through the fourth transistors, each of said second voltage terminals having a ground voltage level.

* * * * *